US009069026B1

(12) United States Patent
Rutkowsky

(10) Patent No.: US 9,069,026 B1
(45) Date of Patent: Jun. 30, 2015

(54) DIAGNOSTIC TOOL FOR TRAILER LIGHTS

(76) Inventor: Eric G. Rutkowsky, Janesville, WI (US)

( * ) Notice: Subject to any disclaimer, the term of this patent is extended or adjusted under 35 U.S.C. 154(b) by 636 days.

(21) Appl. No.: 12/945,154

(22) Filed: Nov. 12, 2010

Related U.S. Application Data

(60) Provisional application No. 61/260,429, filed on Nov. 12, 2009.

(51) Int. Cl.
*G01R 31/00* (2006.01)
*G01R 31/02* (2006.01)
*G01R 31/44* (2006.01)

(52) U.S. Cl.
CPC ............... *G01R 31/00* (2013.01); *G01R 31/44* (2013.01)

(58) Field of Classification Search
CPC .... G01R 31/44; G01R 31/041; G01R 31/026; G01R 1/0416; G01R 31/02; G01R 31/021; G01R 31/04; G01R 1/04; G01R 31/024; G01R 31/025; G01R 31/045; G01R 31/36; B60T 17/22; G01M 17/00
See application file for complete search history.

(56) References Cited

U.S. PATENT DOCUMENTS

| | | | |
|---|---|---|---|
| 3,949,215 A | 4/1976 | Whitney | |
| 4,547,722 A * | 10/1985 | Sarlo | 324/504 |
| 4,884,032 A | 11/1989 | LaPensee | |
| 5,086,277 A * | 2/1992 | Hammerly | 324/504 |
| 5,095,276 A | 3/1992 | Nepil | |
| 5,192,912 A | 3/1993 | Lemon | |
| 5,416,421 A * | 5/1995 | Doland et al. | 324/556 |
| 5,549,478 A * | 8/1996 | McGuire | 439/35 |
| 5,602,482 A | 2/1997 | Gutierrez | |
| 5,604,439 A | 2/1997 | Walkington et al. | |
| 6,081,189 A * | 6/2000 | Warner | 340/458 |
| 6,083,016 A * | 7/2000 | Waynick, Sr. | 439/135 |
| 6,172,508 B1 | 1/2001 | Nutt | |
| 6,297,646 B1 | 10/2001 | Lang et al. | |
| 6,448,779 B1 | 9/2002 | Beaver et al. | |
| 6,535,113 B1 | 3/2003 | Gravolin | |
| 7,124,003 B1 | 10/2006 | West et al. | |
| 7,339,465 B1 * | 3/2008 | Cheng et al. | 340/514 |
| 7,777,495 B2 * | 8/2010 | Mannerfelt | 324/414 |
| 2004/0263178 A1 | 12/2004 | Klaus | |
| 2007/0285100 A1 * | 12/2007 | Hart | 324/504 |
| 2009/0263979 A1 * | 10/2009 | Corless et al. | 439/35 |

* cited by examiner

*Primary Examiner* — Vinh Nguyen
(74) *Attorney, Agent, or Firm* — Robert C. Montgomery; Montgomery Patent & Design, L.P.

(57) ABSTRACT

A diagnostic tool for trailer lights to assist in troubleshooting of trailer wiring and exterior lighting components comprises a small hand-held plastic enclosure and interior electrical diagnostic components. The diagnostic device further comprises a vehicle-type connector and a series of colored indicator lamps. When the diagnostic device is connected to a trailer wiring connector, the indicator lights will inform the user of all working and non-working circuits on the trailer. The device also comprises various types of adapters so as to work with any size trailer from small utility trailers up to large tractor trailer rigs.

14 Claims, 5 Drawing Sheets

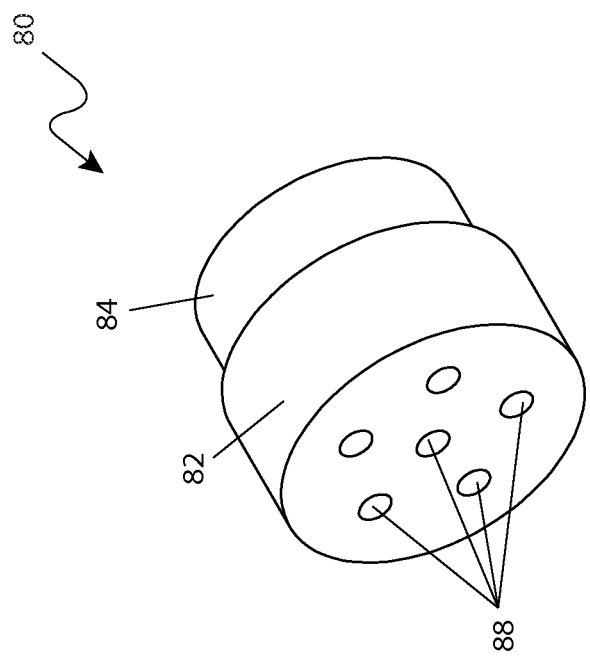
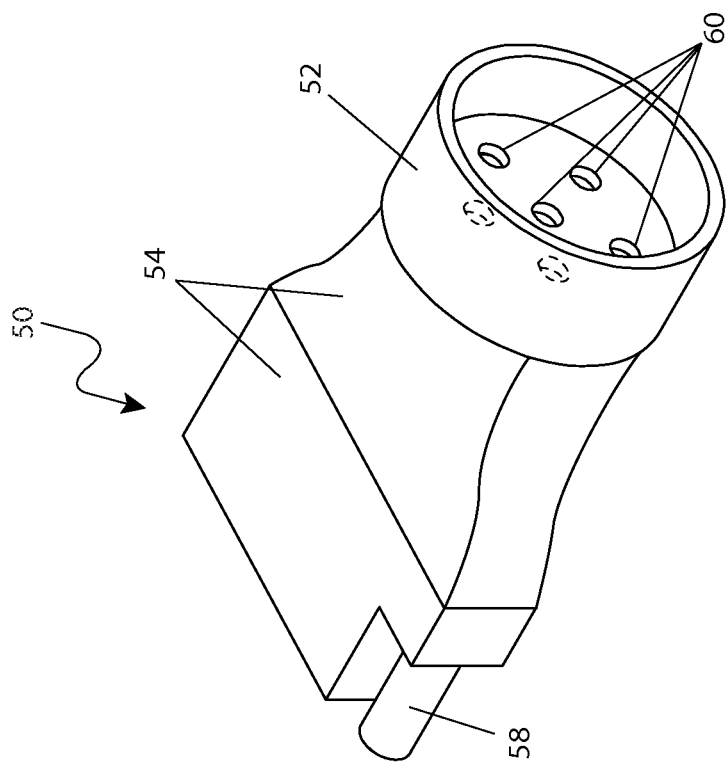

DIAGNOSTIC TOOL FOR TRAILER LIGHTS

RELATED APPLICATIONS

The present invention was first described in and claims the benefit of U.S. Provisional Application No. 61/260,429 filed Nov. 12, 2009, the entire disclosures of which are incorporated herein by reference.

FIELD OF THE INVENTION

The present invention relates generally to tractor trailer lighting systems, and in particular, to a diagnostic tool adapted to test functionality of various circuits of a tractor trailer lighting system.

BACKGROUND OF THE INVENTION

As any professional contractor will attest, nothing beats having the proper tool for a job. The proper tool can save time, save money, produce a higher quality job, reduce damage to equipment, and enhance the safety of all workers. Each field of work has its own type of specialty tools, each performing a specialized task.

One (1) such field where such a specialized task exists is that of troubleshooting and repairing wiring and lighting systems used on trailers. Trailer lighting systems are prone to frequent malfunction and in most such cases it is very difficult to determine which component of the system is the source of the issue.

While the actual wiring repair or light bulb replacement is fairly quick, hours can be spent tracking the problem down. This is aggravating and frustrating for the occasional trailer user, and represents lost time and money for professional repair mechanics.

Various attempts have been made to provide trailer lighting system diagnostic tools. Examples of these attempts can be seen by reference to several U.S. patents including U.S. Pat. No. 4,884,032, U.S. Pat. No. 5,086,277, U.S. Pat. No. 5,095,276, U.S. Pat. No. 5,416,421, U.S. Pat. No. 5,602,482, U.S. Pat. No. 6,081,189, U.S. Pat. No. 6,172,508, and U.S. Pat. No. 6,535,113. However, none of these designs are similar to the present invention.

While these devices fulfill their respective, particular objectives, each of these references suffer from one (1) or more of the aforementioned disadvantages. Many such devices are not adapted for a wide range of trailer connections as is desirable for persons who perform regular testing on a variety of trailers. Also, many such devices are time consuming to setup and activate. Furthermore, many such devices do not provide holistic diagnostic information in a single test in a manner which is easy to interpret. Accordingly, there exists a need for a diagnostic tool for trailer lights without the disadvantages as described above. The development of the present invention substantially departs from the conventional solutions and in doing so fulfills this need.

SUMMARY OF THE INVENTION

In view of the foregoing references, the inventor recognized the aforementioned inherent problems and observed that there is a need for a diagnostic tool for trailer lights adaptable to a variety of trailer connections which provides holistic diagnostic information to a user in a quick and simple manner. Thus, the object of the present invention is to solve the aforementioned disadvantages and provide for this need.

To achieve the above objectives, it is an object of the present invention to diagnose and troubleshoot wiring and exterior lighting components of a trailer. The device comprises a handheld enclosure and a plurality of indicator lamps which are controlled by a printed circuit board housed within the enclosure.

Another object of the present invention is to utilize the indicator lamps to inform a user of functional and defective circuits on the trailer.

Yet still another object of the present invention is to facilitate use with various types of trailer connectors by comprising a plurality of removably attachable adapters. Each adapter comprises a plurality of adapter sockets which removably engage a corresponding plurality of connector pins disposed along an exterior surface of the enclosure. Each adapter further comprises a plurality of male connector pins of varying arrangements corresponding to varying conventional trailer connectors.

Yet still another object of the present invention is to utilize an adapter corresponding to the trailer connector of the trailer such that the device receives corresponding individual electrical signals from each component of the trailer lighting system.

Yet still another object of the present invention is to comprise the circuit board of a plurality of individual continuity testing circuits for corresponding trailer illumination circuits. Each continuity testing circuit causes a corresponding indicator lamp to illuminate if the corresponding trailer illumination circuit is functioning properly. In this manner, the user can identify a non-functioning circuit by the non-lighting of the corresponding indicator lamp.

Yet still another object of the present invention is to allow for portable reuse by comprising an internal rechargeable battery power source for the circuit board and indicator lamps.

Yet still another object of the present invention is to provide a method of utilizing the device that provides a unique means of obtaining an instance of the apparatus, attaching a desired adapter to the enclosure, inserting the male connector pins of the adapter into the trailer connector, viewing the indicator lamps to determine which of the circuits of the trailer lighting system are functioning continuously and which are not, making corresponding repairs, and verifying the efficacy of the repairs by repeating the above steps.

Further objects and advantages of the present invention will become apparent from a consideration of the drawings and ensuing description.

BRIEF DESCRIPTION OF THE DRAWINGS

The advantages and features of the present invention will become better understood with reference to the following more detailed description and claims taken in conjunction with the accompanying drawings, in which like elements are identified with like symbols, and in which:

FIG. 4a is a rear perspective view of the first adapter portion 50 of the diagnostic tool for trailer lights 10, according to a preferred embodiment of the present invention;

FIG. 4b is a rear perspective view of the second adapter portion 80 of the diagnostic tool for trailer lights 10, according to a preferred embodiment of the present invention; and, FIG. 5 is an electrical block diagram of the diagnostic tool for trailer lights 10, according to a preferred embodiment of the present invention.

Figure 1:
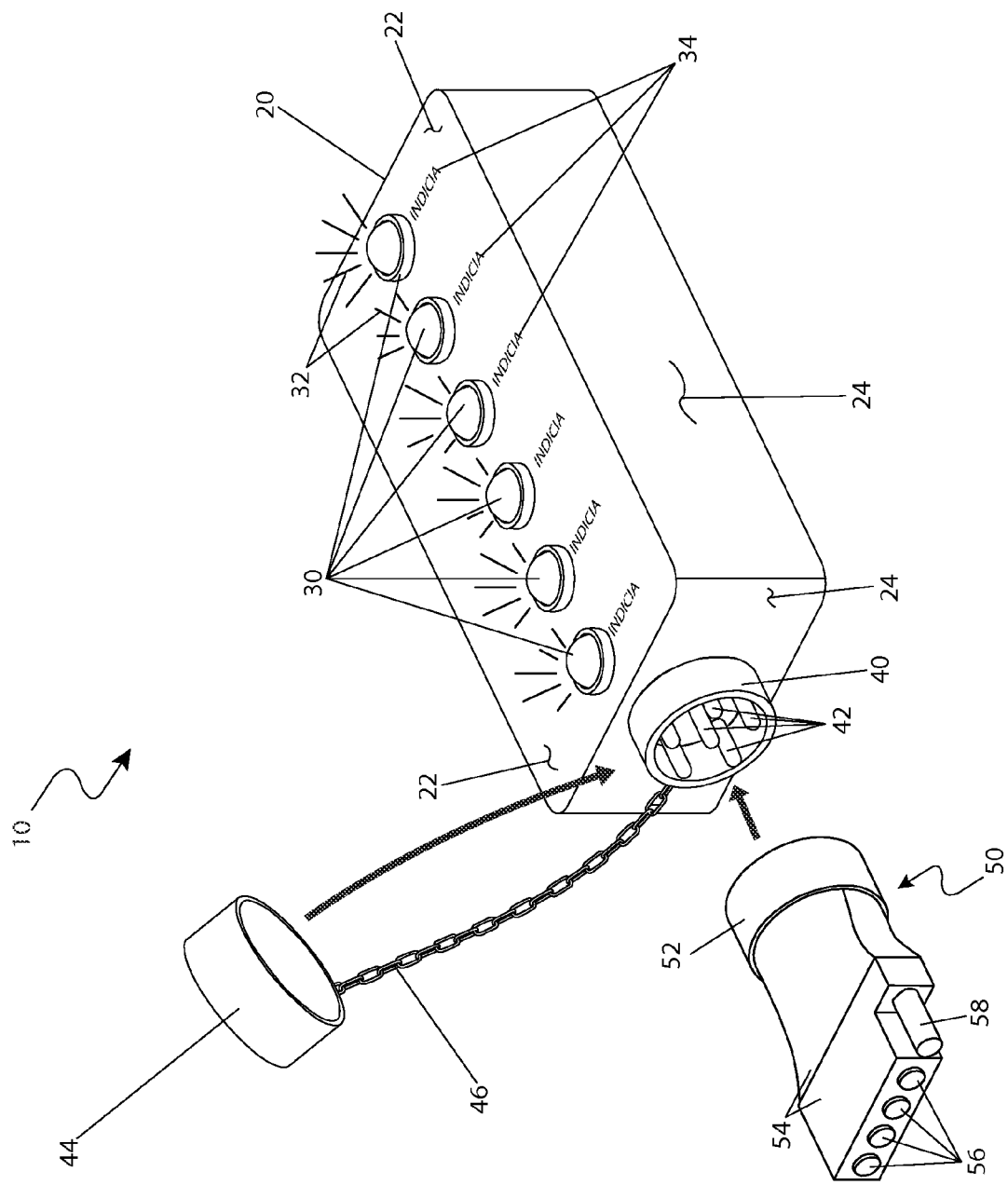
FIG. 1 is a perspective view of a diagnostic tool for trailer lights 10 depicting attachment of a first adapter portion 50, according to a preferred embodiment of the present invention.

DESCRIPTIVE KEY 10 diagnostic tool for trailer lights
20 enclosure
22 upper surface
24 side surface
26 bottom surface
30 illuminating lens
32 illumination
34 indicia
40 connector
42 connector pin
44 cap
46 tether
50 first adapter
52 first adapter collar
54 first adapter body
56 first adapter female plug
58 first adapter male plug
60 first adapter socket
70 battery
71 battery compartment
72 battery compartment cover
74 clasp
80 second adapter
82 second adapter collar
84 second adapter body
86 second adapter pin
88 second adapter socket
90 circuit board
92 lamp
94 diode
96 resistor
98 wiring
100 trailer connector

DETAILED DESCRIPTION OF THE PREFERRED EMBODIMENT

The best mode for carrying out the invention is presented in terms of its preferred embodiment, herein depicted within FIGS. 1 through 5. However, the invention is not limited to the described embodiment and a person skilled in the art will appreciate that many other embodiments of the invention are possible without deviating from the basic concept of the invention, and that any such work around will also fall under scope of this invention. It is envisioned that other styles and configurations of the present invention can be easily incorporated into the teachings of the present invention, and only one particular configuration shall be shown and described for purposes of clarity and disclosure and not by way of limitation of scope.

The terms "a" and "an" herein do not denote a limitation of quantity, but rather denote the presence of at least one of the referenced items.

The present invention describes a diagnostic tool for trailer lights (herein described as the "device") 10, which provides a means to diagnose and troubleshoot trailer wiring and exterior lighting components. The device 10 comprises a small hand-held plastic enclosure 20 with external illuminating lenses 30 and an interior electronic printed circuit board 90. The device 10 further comprises a vehicle-type first connector 40. When the device 10 is connected to a trailer wiring connector 100, the indicator lamps 92 inform a user of all functional and defective circuits on the trailer. The device 10 also comprises a first adapter 50 and a second adapter 80 which are removably attachable to the device 10, thereby allowing use of the device 10 with various trailer connectors 100 found on various trailers from small utility trailers up to large tractor trailer rigs.

Referring now to FIG. 1, a perspective view of the device 10, according to the preferred embodiment of the present invention, is disclosed. The device 10 comprises a rectangular electronic enclosure 20, a plurality of lamps 92 preferably being light-emitting diodes (LED's) or equivalent illuminating devices, and a multi-pin connector 40.

The enclosure 20 is envisioned to be fabricated of a plastic material made in an injection molding process or using a formed sheet metal type construction. The enclosure 20 is to be sufficiently sized so that it may be easily carried to a site in which it is needed. The enclosure 20 comprises a box-like shape with an upper surface 22, four (4) side surfaces 24, and a bottom surface 26; however, it is understood that the enclosure 20 may be introduced in a plurality of sizes, while being suitable for operably holding in one (1) hand of a user.

Figure 5:
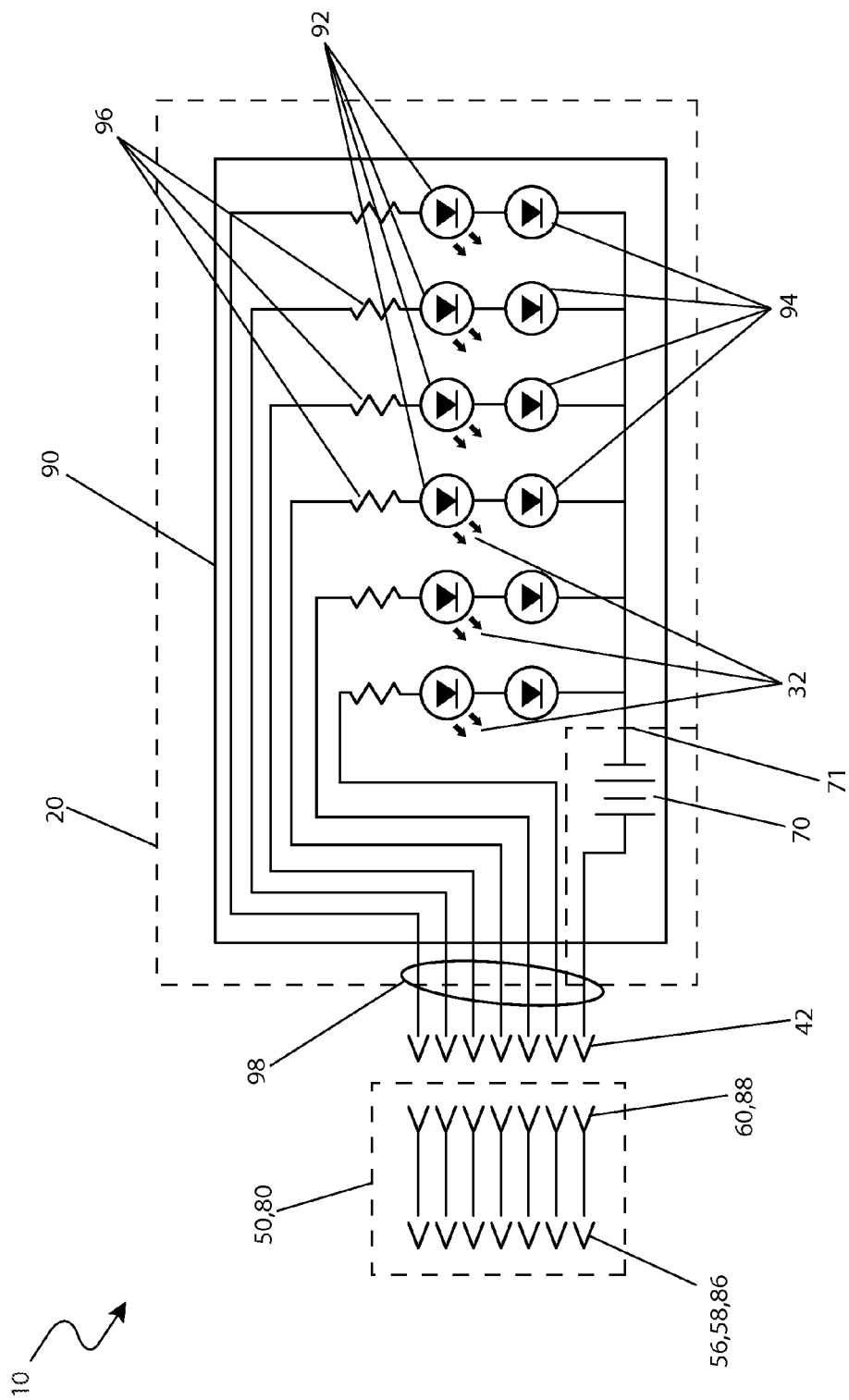

A plurality of illuminated lenses 30 protrude upwardly from the upper surface 22 of the enclosure 20 which convey an illumination 32 emitted from subjacent lamps 92 located within said enclosure 20 (see FIG. 5). The device 10 is envisioned to comprise six (6) illuminating lenses 30; however, it is understood that said device 10 may incorporate more or less illuminating lenses 30 as desired depending on an anticipated number of circuits utilized on the trailer being communicated via a trailer connector 100 (see FIG. 3). Each illuminating lens 30 is designated to a specific trailer circuit that is standard with trailer utilization such as, left turn signal, right turn signal, running lights, brake, electrical brake, and the like, being indicated along an upper surface of the enclosure 20 via corresponding molded, imprinted, painted indicia 34, or otherwise disposed, adjacent to a corresponding lens 30. The illuminating lenses 30 and corresponding lamps 92 allow the user to readily view which circuit or circuits are of concern without having to flip a switch or turn a knob, thereby allowing the other hand to be free during operation. Furthermore, the illuminating lenses 30 may comprise a single color or may comprise various colors to represent different trailer circuits to better assist the user in determining which circuit(s), if any, are in need of attention.

The enclosure 20 comprises an integral connector 40 along a side surface 24. Said connector 40 comprises a plurality of male connector pins 42 being in electrical communication with an internal circuit board 90 and the lamps 92 within the enclosure 20 (see FIG. 5). The connector 40 is illustrated here comprising a 7-pin type unit with a cylindrical outer sleeve portion having male connector pins 42 being arranged in a generally circular pattern and designed to emulate a standard vehicle/trailer connector, thereby allowing normal attachment of the device 10 to a standard 7-pin trailer plug 100 in a conventional manner; however, it is understood that an actual number of pins 42 incorporated within the connector 40 may vary based upon a particular anticipated usage without deviating from the concept and as such should not be interpreted as a limiting factor of the device 10. Said connector 40 is envisioned to be in accordance with all applicable state and federal standards and regulations for such connectors. The connector 40 also comprises a cylindrical plastic protective cap 44 providing an interference fit upon the connector 40 to protect the connector pins 42 when the device 10 is not in use. Said connector 40 further comprises a tether 46 being affixed to said cap 44 and the connector 40 being riveted or welded thereto and made using a light-gauge chain or equivalent flexible connecting material.

The device 10 also comprises a first adapter 50 which provides a means of converting the aforementioned connector 40, thereby allowing easy attachment to a common 3-way, 4-way, or 5-way flat-style trailer connector 100 that may come standard with some trailers. Said first adapter 50 comprises a unitary molded body further comprising a female adapter collar 52 which provides inserted attachment to said connector 40, a contoured plastic or rubber first adapter body 54, a plurality of first adapter female plugs 56, a first adapter male plug 58, and a plurality of first adapter sockets 60 which are arranged in a corresponding manner to the aforementioned connector pins 42 to provide normal insertion (see FIG. 4a).

Figure 2:
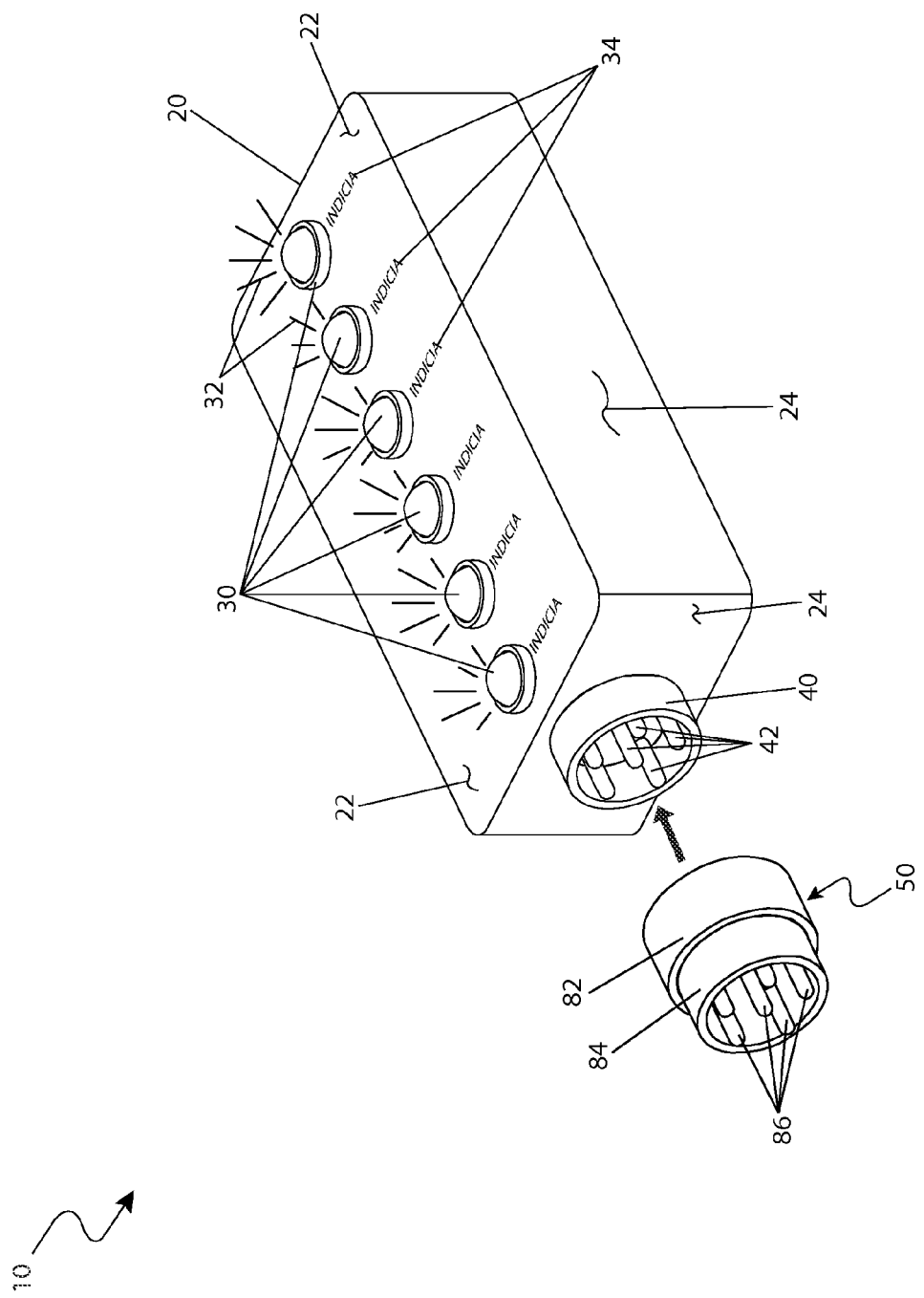
FIG. 2 is another perspective view of the diagnostic tool for trailer lights 10 depicting attachment of a second adapter portion 80, according to a preferred embodiment of the present invention.

The device 10 also comprises a second adapter 80 which functions in a similar manner as the aforementioned first adapter 50 by providing conversion of the connector 40 for yet additional trailer connectors 100 (see FIG. 2).

The number of lenses 30 that may be illuminated during use of the device 10 may vary based upon a particular configuration of the enclosure 20 and the adapters 50, 80 such as: utilizing the device 10 without an adapter 50, 80; utilizing the device 10 with an adapter 50, 80; and, based upon a number of active circuits within the trailer connector 100. Both the connector 40 and the adapters 50, 80 comprise one (1) pin 42, 58, 86 to be utilized as a ground. Therefore, as an example, if the trailer connector 100 only comprises four (4) connection pins, then the maximum number of lenses 30 that may illuminate 32 would be three (3). Furthermore, if the trailer connector 100 only comprises five (5) connection pins, then the maximum number of lenses 30 that may illuminate would be four (4), and so on.

Referring now to FIG. 2, a perspective view of the device 10 depicting attachment of a second adapter portion 80, according to a preferred embodiment of the present invention, is disclosed. The device 10 comprises a removably attachable second adapter 80 which provides similar function as the aforementioned first adapter 50; however, said second adapter 80 enables conversion of the connector 40 to mate to a standard round 4-way or 5-way trailer connector 100. The second adapter 80 comprises a second adapter collar 82, a second adapter body 84, a plurality of second adapter pins 86, and a plurality of second adapter sockets 88 which are arranged in a corresponding manner to the aforementioned connector pins 42 to provide normal insertion with the connector 40 (see FIG. 4b).

Figure 3:
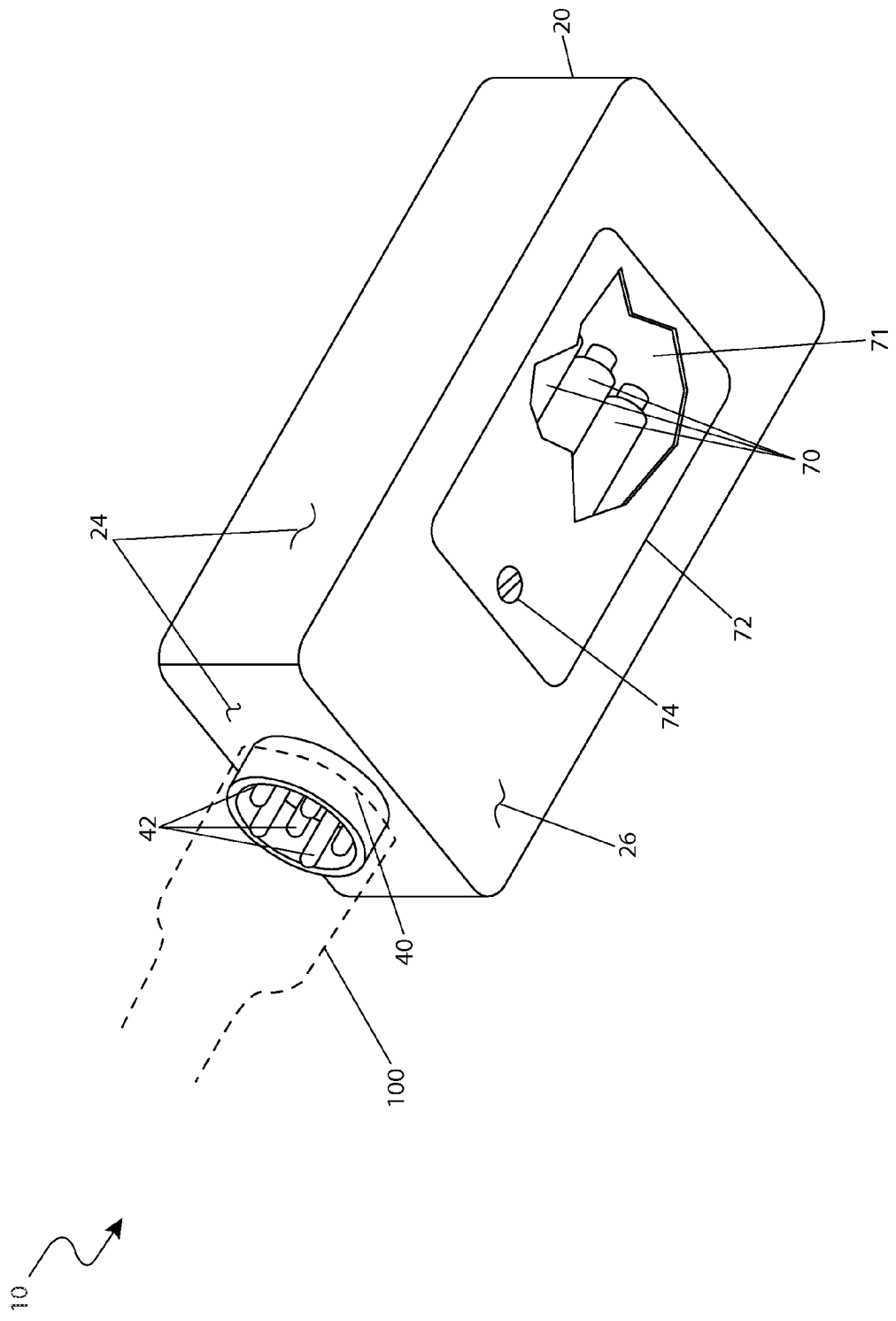
FIG. 3 is a bottom perspective view of the diagnostic tool for trailer lights 10 depicting a battery compartment portion 71, according to a preferred embodiment of the present invention.

Referring now to FIG. 3, a bottom perspective view of the device 10 depicting a battery compartment portion 71, according to a preferred embodiment of the present invention, is disclosed. The device 10 provides electrical energy to activate the trailer lighting circuits and bulbs via at least one (1) internal rechargeable or disposable battery 70 within the enclosure (see FIG. 5). The device 10 further comprises a battery compartment 71 secured by a battery compartment cover 72 being flush with and removably attached to a bottom surface 26 of the enclosure 20 via a common coin or tool operable clasp 74.

Referring now to FIGS. 4a and 4b, rear perspective views of first 50 and second 80 adapter portions of the device 10, according to a preferred embodiment of the present invention, are disclosed.

FIG. 5 is an electrical block diagram of the device 10, according to a preferred embodiment of the present invention, is disclosed. The device 10 comprises an internal circuit board 90 which provides electrical and electronic equipment necessary to the operation of the device 10. The circuit board 90 provides preferably six (6) individual continuity testing circuits for corresponding trailer illumination circuits to be connected to and tested; however, it is understood that the actual number of lenses 30, lamps 32, and corresponding circuits may vary based upon a particular intended use of the device 10 without deviating from the concept and as such should not be a limiting factor of the device 10. The circuit board 90 preferably comprises a conventional printed circuit board or equivalent circuit technology and further comprises a plurality of parallel testing circuits being powered by the aforementioned battery or batteries 70 (see FIG. 3). Each testing circuit comprises a lamp 92, a diode 94, and a resistor 94. The resistors 96 are utilized to reduce the voltage going to the lamps 92 to provide a safe level of current. The diodes 94 are utilized within the circuit to serve as a means to isolate the circuits and to prevent interference therebetween. Said lamp 92, diode 94, and resistor 94 are arranged in series and are in electrical communication with the connector 40 and the battery 70 via common interconnecting wiring 98. Said lamps 92 are preferably light-emitting diodes (LED's) or equivalent illumination devices. Each electrical signal received by the circuit board 90 from the trailer connector 100 which is correct causes a respective lamp 92 to illuminate 32, thereby providing a visual indication that a particular trailer circuit is operational. If there is a continuity problem with one (1) or more of the trailer circuits, the respective lamp 92, as identified by the aforementioned indicia 34, will not illuminate 32.

The battery 70 or batteries 70 are utilized to supply power to the diagnostic device 10 by providing a load within the device 10 that emits a current that will flow from the connector 40; through the trailer connector 100 and wiring, through the bulbs within the trailer wiring; back to the circuit board 90; and, finally through the respective lamps 92. The illumination 32 of the lamp 92 indicates to a user whether each trailer circuit is functioning correctly. If there is a short in the wire or a bulb is no longer operational, an open circuit is present and no current will flow to illuminate 32 the lamp 92. By the lack of illumination 32 of a designated lens 30, the user is thus warned that there is a short, fault, or continuity problem in that circuit.

It is envisioned that other styles and configurations of the present invention can be easily incorporated into the teachings of the present invention, and only one particular configuration shall be shown and described for purposes of clarity and disclosure and not by way of limitation of scope.

The preferred embodiment of the present invention can be utilized by the common user in a simple and effortless manner with little or no training. After initial purchase or acquisition of the apparatus 10, it would be configured as indicated in FIGS. 1 and 2.

The method of utilizing the apparatus 10 may be achieved by performing the following steps: procuring a desired model of the device 10 having a desired number of connector pins 42, adapters 50, 80, and lamps 92; unplugging or otherwise exposing the trailer connector 100 for testing; placing the device 10 into electrical communication therewith the trailer circuitry by inserting an appropriate adapter 50, 80 into the connector 40, if necessary; inserting the trailer connector 100 into the adapter 50, 80 or connector 40, depending on a particular configuration; viewing the lenses 30 to determine if the appropriate lamps 92 are illuminated; making necessary repairs and/or adjustments to the trailer circuitry as required; retesting as previously described, to verify a successful repair; and, removing the device 10 therefrom the trailer connector 40 upon completion of diagnosing the trailer circuitry.

The device 10 may be utilized prior to mounting the trailer upon a vehicle so that the user may know that the trailer lighting system is operating properly. The device 10 may be utilized in a manner which allows it to be operable with only one (1) person required to analyze the operation of all the circuitry and bulbs of the trailer lighting system to locate shorts, faults, continuity problems, or other trailer wiring problems. The device 10 allows one (1) user to readily isolate and identify any problem that may surface in a quick and efficient manner.

The device 10 takes the form of a rectangular enclosure 20 which houses an internal electrical circuit 90 that is utilized with a series of LED-type lamps 92 to determine if there is a problem or fault with the trailer circuitry. The circuit board 90 is integrated therewithin the enclosure 20 so that the electrical components within are protected from external effects and yet still allow for said enclosure 20 to be adequately sized and easily portable. As illustrated in FIG. 1, the lenses 30 are externally mounted on the upper surface 22 of the device 10 for easy viewing of the illuminated 32 lamps 92. Said illumination 32 of the lamps 92 provide a means for the user to test the trailer circuits via illumination 32 of the lamps 92 when the trailer circuits that are being tested are operational, and not illuminating 32 if a the trailer circuits being tested are not operating correctly.

The connector 40 is envisioned to be of a standard design and variety being extensively used for private use as well as industrial use so that the device 10 may quickly be connected to many types of trailer connectors 100 with no modifications required to the connector 40. The first adapter 50 may be utilized in those instances when the trailer connector 100 comprises a round connector with a different number of connections as compared to the connector 40. The second adapter 80 may be utilized when attaching the device 10 to a flat-style trailer connector 100, thereby not being insertable into the connector 40. The connector 40 has a series of connector pins 42 that are electrically connected to particular predetermined trailer lighting circuits to illuminate a lamp 92 and superjacent lens 30 being identified with a certain trailer circuit and function as indicated by the accompanying indicia 34, such as, brake lights, parking lights, left turn signal, right turn signal, and the like.

The device 10 connects to the trailer connector 100 and attached circuitry via the connector 40, with or without an adapter 50, 80, allowing an electrical load from the battery 70 to flow from the device 10, through the connector 40, into the trailer connector 100, through the circuitry of the trailer, back through the trailer connector 40, and to the circuit board 90 to illuminate 32 the lamps 92 and lenses 30 to provide a visible indicator to the user whether the trailer circuitry is functioning correctly. The illumination 32 of the lamps 92 is to be as noticeable in daylight as at night, so that the user may easily diagnose the trailer circuitry in any lighting condition.

The foregoing descriptions of specific embodiments of the present invention have been presented for purposes of illustration and description. They are not intended to be exhaustive or to limit the invention and method of use to the precise forms disclosed. Obviously many modifications and variations are possible in light of the above teaching. The embodiment was chosen and described in order to best explain the principles of the invention and its practical application, and to thereby enable others skilled in the art to best utilize the invention and various embodiments with various modifications as are suited to the particular use contemplated. It is understood that various omissions or substitutions of equivalents are contemplated as circumstance may suggest or render expedient, but is intended to cover the application or implementation without departing from the spirit or scope of the claims of the present invention.

What is claimed is:

1. A trailer light tester for testing a trailer comprising a plurality of trailer lights, a plurality of trailer light circuits and a trailer connector, said tester comprising:
   a hand-held enclosure;
   a battery within said enclosure;
   a circuit board within said enclosure and electrically connected to said battery, said circuit board comprising electronics and a plurality of lamps, each lamp of said plurality of lamps for signaling the operational status of an electrically associated trailer light circuit of said plurality of trailer light circuits;
   a multi-pin connector on said enclosure, said multi-pin connector for electrical connection between said trailer connector and said circuit board, said multi-pin connector comprising a plurality of connector pins, each connector pin of said plurality of connector pins being connected to an electrically associated lamp of said plurality of lamps, wherein said plurality of lamps are electrically connected to said battery in parallel, such that each lamp automatically signals said operational status of only a respectively electrically associated trailer light circuit connected to a respectively electrically associated connector pin;
   a removable adapter for mating to said multi-pin connector, said adapter comprising a plurality of adapter connector pins, each adapter connector pin being connected to an electrically associated connector pin of said plurality of connector pins and an adapter collar attachable to said multi-pin connector; and,
   a plurality of indicia, each indicia of said plurality of indicia being associated with each lamp of said plurality of lamps and describing said trailer light circuit electrically associated with a respectively electrically associated lamp of said plurality of lamps;
   wherein said adapter is for electrically connecting said multi-pin connector to said trailer connector.

2. The trailer light tester of claim 1, wherein each lamp includes an illumination lens.

3. The trailer light tester of claim 1, wherein each lamp of said plurality of lamps is a light emitting diode, and wherein said electronics comprises:
   a plurality of diodes, each diode of said plurality of diodes being connected in series with an electrically associated lamp of said plurality of lamps; and
   a plurality of resistors, each resistor of said plurality of resistors being connected in series with an electrically associated lamp of said plurality of lamps.

4. The trailer light tester of claim 1, wherein said each lamp of said plurality of lamps automatically signals a defective condition of said respectively electrically associated trailer light circuit of said plurality of trailer light circuits.

5. The trailer light tester of claim 4, wherein said defective condition is a shorted trailer light circuit.

6. The trailer light tester of claim 4, wherein said defective condition is an open trailer light circuit.

7. The trailer light tester of claim 4, wherein said respectively electrically associated trailer light circuit is a turn signal of said trailer.

8. The trailer light tester of claim 4, wherein said respectively electrically associated trailer light circuit is a brake light of said trailer.

9. The trailer light tester of claim 1, wherein said multi-pin connector comprises a ground pin, wherein said ground pin is a male pin.

10. The trailer light tester of claim 1, wherein said trailer connector is a 4 pin connector.

11. The trailer light tester of claim 1, wherein said multi-pin connector and said adapter each have one ground pin.

12. The trailer light tester of claim 1, wherein a mating end that mates with said multi-pin connector of said trailer connector is a flat trailer connector.

13. The trailer light tester of claim 1, wherein a mating end that mates with said multi-pin connector of said trailer connector is a round trailer connector.

14. The trailer light tester of claim 1, further comprising a cap tethered to said multi-pin connector, said cap configured to mate with said multi-pin connector to protect said plurality of connector pins.

\* \* \* \* \*